US006834369B2

(12) United States Patent
Shimada et al.

(10) Patent No.: US 6,834,369 B2
(45) Date of Patent: Dec. 21, 2004

(54) APPARATUS AND METHOD FOR DETERMINING A MOST LIKELY CODE WORD IN A DIGITAL DATA TRANSMISSION SYSTEM

(75) Inventors: Michio Shimada, Kanagawa (JP); Hisashi Suzuki, Tokyo (JP)

(73) Assignee: Machine Learning Laboratory, Inc., Kanagawa (JP)

( * ) Notice: Subject to any disclaimer, the term of this patent is extended or adjusted under 35 U.S.C. 154(b) by 491 days.

(21) Appl. No.: 09/884,073

(22) Filed: Jun. 20, 2001

(65) Prior Publication Data

US 2001/0056566 A1 Dec. 27, 2001

(30) Foreign Application Priority Data

Jun. 21, 2000 (JP) ........................................ 2000-185886
Jun. 18, 2001 (JP) ........................................ 2001-183456

(51) Int. Cl.[7] ............................................ H03M 13/03
(52) U.S. Cl. ...................... 714/794; 375/262; 375/341; 704/242
(58) Field of Search ................................. 714/712, 791, 714/794, 795, 796; 375/262, 341; 704/242

(56) References Cited

U.S. PATENT DOCUMENTS

| | | | | | |
|---|---|---|---|---|---|
| 4,404,674 A | * | 9/1983 | Rhodes | ...................... | 714/793 |
| 4,539,078 A | * | 9/1985 | Wingfield | ................... | 205/150 |
| 4,539,684 A | * | 9/1985 | Kloker | ....................... | 714/789 |
| 4,853,930 A | * | 8/1989 | Shimada | ...................... | 371/43 |
| 4,878,221 A | * | 10/1989 | Shimada | ...................... | 371/43 |
| 5,014,275 A | * | 5/1991 | Shimoda et al. | ........... | 714/791 |
| 5,079,771 A | * | 1/1992 | Shimada | ...................... | 371/43 |

* cited by examiner

*Primary Examiner*—Guy J. Lamarre
(74) *Attorney, Agent, or Firm*—Sughrue Mion, PLLC

(57) ABSTRACT

In order to rapidly determine a most likely code word at a decoder provided in a digital data transmission system using block codes or convolutional codes for the purposes of combating a noisy channel environment, an adaptively controllable threshold is introduced so as to discriminate a largest metric with a small amount of computations. The metric is the measure of closeness of a signal transmitted to the decoder to one of plural code words previously stored in the decoder. A counter counts the number of metrics each exceeding the threshold, and informs a controller of the count result, if the count result is more than one, the controller raises the threshold, on the contrary, if the count result is zero then the controller lowers the threshold, both are performed in an effort to narrow down one metric in excess of the threshold. The threshold thus adaptively controlled is compared with each of plural metrics. If the count result becomes one, it implies that the largest metric has been determined. Subsequently, a code word corresponding to the largest metric is regarded as the most likely code word.

14 Claims, 15 Drawing Sheets

$$N(1) = \begin{cases} M(1) & \text{IF } M(1) \geq M(2) \\ M(2) & \text{IF } M(1) < M(2) \end{cases}$$

$$D(1) = \begin{cases} C(1) & \text{IF } M(1) \geq M(2) \\ C(2) & \text{IF } M(1) < M(2) \end{cases}$$

APPARATUS AND METHOD FOR DETERMINING A MOST LIKELY CODE WORD IN A DIGITAL DATA TRANSMISSION SYSTEM

BACKGROUND OF THE INVENTION

1. Field of the Invention

The present invention relates generally to a digital date transmission system using error-correcting (or error control) codes, and more specifically to techniques for determining a maximum metric and thereafter specifying a most likely code word corresponding thereto in a decoder provided in such a system.

2. Description of Related Art

It is known in the art that in order to reliably reproduce information sequences transmitted over a noisy channel, a wide variety of error control coding/decoding techniques using block codes or convolutional codes have been proposed.

Prior to turning to the present invention, it is deemed preferable to briefly describe, with reference to FIGS. 1–5, a conventional digital data transmission system using block codes so as to combat noisy transmission environments.

FIG. 1 is a block diagram showing a simplified example of a transmitter 10 which is provided in a typical digital data transmission system and which utilizes block codes for the purposes of error-correcting coding. Since the transmitter 10 itself is well known in the art, and accordingly, only a brief description thereof will be given. An encoder (channel encoder) 12 is supplied with an information sequence U and divides the same into message blocks of a fixed bit length each. For the sake of simplifying the descriptions, it is assumed that each message block is represented by a binary 4-tuple called a message, and hence there are $2^4$ (=16) different possible messages (depicted by U(1)–U(16)). The encoder 12 transforms the messages U(1)–U(16) independently into code words C(1)–C(16) on a one-to-one basis using a coding table 14 listed below the encoder 12.

A modulator 16 receives successively the code words outputted from the encoder 12 and translates them into corresponding analog baseband signal 18. Following this, an up-converter 20 converts, using a local oscillator (not shown), the analog base-band signal 18 to an operating frequency of the transmitter 10 in preparation for transmission, after which the code modulated high-frequency signal is radiated to the destination via an antenna 22.

FIG. 2 is a block diagram schematically showing a simplified example of a receiver (depicted by 24). The code modulated high-frequency signal, transmitted from the transmitter 10, is applied to a down-converter 26 by way of an antenna 25. The down-converter 26 operates such as to convert the incoming high-frequency signal to the corresponding analog baseband signal using a local oscillator (not shown). The analog baseband signal is applied to a demodulator 28, which in turn generates a demodulated received signal R. A decoder (i.e., channel decoder) 30 is supplied with the signal R, estimating an original code word and generating the estimate as a reproduced information sequence.

Referring to FIG. 3, the decoder 30 (FIG. 2) is shown in detail in terms of configuration thereof. As illustrated, the decoder 30 is comprised of a memory 40, a plurality of metric calculators 42(1)–42(16) which are identical with each other in both configuration and function, a most likely code word determiner 44, and a code converter 46. The metric calculators 42(1)–42(16) are respectively supplied with the code words C(1)–C(16) previously stored in the memory 40 and identical to those used in the transmitter 24, and also supplied with the received signal R which has been demodulated at the demodulator 28 of FIG. 2. Each of the metric calculators 42(1)–42(16) calculates a metric which is a measure of the closeness of the received signal R to the corresponding code word (viz., one of C(1)–C(16)), and applies a corresponding metric (viz., one of M(1)–M(18)) to the most likely cord word determiner 44. This determiner 44 searches the maximum metric among the metrics M(1)–M(16) applied thereto, and determines one code word corresponding to the maximum metric, the operation of which will be further described later. The code word thus determined, viz., the output of the determiner 44, is depicted by D(15), and is subject to code conversion at the code converter 46 and outputted therefrom as a reproduced information sequence.

FIG. 4 is a block diagram showing the detail of the most likely code word determiner 44 (FIG. 3) which comprises a plurality of selectors 50(1)–50(15). In brief, the determiner 44 operates such as to detect the maximum metric among the inputted metrics M(1)–M(16) in a tournament-like manner until only one remains, and then determine and generate the most likely code word (one of C(1)–C(16)) corresponding to the detected maximum metric.

The selectors 50(1)–50(15) are substantially identical with each other in both configuration and function, and as such, the selector 50(1) is mainly described. As shown in FIG. 4, the selector 50(1) receives two pairs of {M(1), C(1)} and {M(2), C(2)}, comparing the received metrics of M(1) and M(2), and selecting and outputting either pair with the larger metric. The pair (viz, {M(1), C(1)} or {M(2), C(2)}) selected at the selector 50(1) is depicted by {N(1), D(1)}. More specifically, if the selector 50(1) selects the pair {M(1), C(1)}, the output N(1) equals M(1), and the output D(1) equals C(1).

Each of the remaining selectors 50(2)–50(15) operates in exactly the same manner as the selector 50(1) and outputs the corresponding pair {N(k), D(k)} (k=2, 3, . . . 15). The rightmost selector 50(15) eventually determines one pair, wherein the metric (=N(15)) exhibits the maximum value and wherein the cord word D(15) corresponds to the maximum metric N(15) and is regarded as the most likely code word. Note that the metric N(15) outputted from comparator 50(15) has done the job and thus will not used in the subsequent processing. The code word D(15) thus detected corresponds to one of the cord words C(1)–C(16) and applied to the code converter 46 (FIG. 3), whereat the code word is converted to the corresponding information sequence (depicted by U) as mentioned above.

The selector 50(1) of FIG. 4 will further be described with reference to FIG. 5. As shown in FIG. 5, the selector 50(1) is comprised of a comparator 52 and two selectors 54 and 56. The comparator 52 compares the two metrics M(1) and M(2), and applies the comparison result to the selectors 54 and 56. The selector 54 responds to the comparison result and selects M(1) as N(1) if M(1)≧M(2), and selects M(2) as N(1) if M(1)<M(2). On the other hand, the selector 56 is responsive to the comparison result and outputs C(1) as D(1) if M(1)≧M(2), and output C(2) as D(1) If M(1)<M(2).

Returning to FIG. 4, the most likely code word determiner 44 is provided with four (4) stages for selecting the larger metric each, because it has been assumed that each message is a binary 4-tuple. In general, if Q represents the different possible messages to be transmitted, the number of the metric selecting stages at the determiner 44 is given by $\log_2 Q$. Namely, the number of the metric selecting stages of the determiner 44 increases with increase in the different possible messages to be transmitted. On the other hand, the computation at each stage of the determiner 44 accompanies the comparing operation, which inevitably incurs a relatively large delay. Accordingly, the aforesaid conventional techniques for determining the most likely code word has encountered the problems that it is practically not applicable to a system that requires a very high transmission speed. By way of example, with the Viterbi decoder, the value of Q is typically limited to a range of $2^4$ to $2^7$ because if Q is made larger that that, it is impossible to realize a practically available decoder due to the slow speed of decoding operations.

SUMMARY OF THE INVENTION

It is therefore an object of the present invention to provide an apparatus, provided in a decoder of error-correcting codes, which is able to rapidly determine a most likely code word with a small amount of computations compared to the conventional technique.

Another object of the present invention is to provide a method of determining a most likely code word in a decoder of error-correcting codes at a high speed compared to the conventional technique.

In brief, these objects are achieved by the techniques wherein, in order to rapidly determine a most likely code word at a decoder provided in a digital data transmission system using block codes or convolutional codes for the purposes of combating a noisy channel environment, an adaptively controllable threshold is introduced so as to discriminate a largest metric with a small amount of computations. The metric is the measure of closeness of a signal transmitted to the decoder to one of plural code words previously stored in the decoder. A counter counts the number of metrics each exceeding the threshold, and informs a controller of the count result. If the count result is more than one, the controller raises the threshold, on the contrary, if the count result is zero then the controller lowers the threshold, both are performed in an effort to narrow down one metric in excess of the threshold. The threshold thus adaptively controlled is compared with each of plural metrics. If the count result becomes one, it implies that the largest metric has been determined. Subsequently, a code word corresponding to the largest metric is regarded as the most likely code word.

One aspect of the present invention resides in a most likely code word determiner provided in a decoder of a digital data transmission system using error-correcting codes for combating noisy environments, comprising a plurality of comparators which respectively receive a plurality of metrics each indicating closeness of a corresponding code word to a signal transmitted to the decoder, the plurality of comparators respectively comparing the plurality of metrics with a threshold and generating a plurality of comparison results. A counter coupled to receive the plurality of comparison results, counting a number of comparison results each of which indicates that the corresponding metric exceeds the threshold, and generating a count result indicating that the number of comparison results is zero or one or more than one. Further, a controller coupled to receive the count result and issuing an acknowledge signal indicating that the count result is zero or one or more than one, the controller changing the threshold if the count result is zero or more than one and applying the changed threshold to the plurality of comparators. A selector coupled to receive the plurality of comparison results and a plurality of code words previously prepared in the decoder, the selector selecting a code word which is defined as the most likely code word if the acknowledge signal indicates that the count result is one.

Another aspect of the present invention resides in a method of determining a most likely code word in a decoder of a digital data transmission system using error-correcting codes for combating noisy environments, comprising the steps of: (a) receiving a plurality of metrics each indicating closeness of a corresponding code word to a signal transmitted to the decoder, comparing the plurality of metrics with a threshold, and generating a plurality of comparison results; (b) receiving the plurality of comparison results, counting a number of comparison results each of which indicates that the corresponding metric exceeds the threshold, and generating a count result indicating that the number of comparison results is zero or one or more than one; (c) receiving the count result and issuing an acknowledge signal indicating that the count result is zero or one or more than one, changing the threshold if the count result is zero or more than one and generating the changed threshold which is used at step (a); and (d) receiving the plurality of comparison results and a plurality of code words previously prepared in the decoder, and selecting a code word which is defined as the most likely code word if the acknowledge signal indicates that the count result is one.

Still another aspect of the present invention resides in a most likely code word determiner provided in a decoder of a digital data transmission system using error-correcting codes for combating noisy environments, comprising a plurality of metric calculators for respectively calculating a plurality of metrics each indicating closeness of a corresponding code word to a signal transmitted to the decoder, and accumulating the calculated metrics and storing same therein, each of the plurality of metrics being represented by a sign bit and an absolute value. Further, a counter coupled to receive the sign bits, counting a number of sign bits each indicating a non-negative sign bit, and generating a count result indicating that the number of the non-negative sign bits is zero or one or more than one. A controller coupled to receive the count result and issuing an acknowledge signal indicating that the count result is zero or one or more than one, the controller operating such as to add a predetermined value to each of the accumulated metrics if the count result is zero, and subtract the predetermined value from each of the accumulated metrics if the count result is more than one. A selector coupled to receive the sign bits and a plurality of code words previously prepared in the decoder, the selector selecting a code word which is defined as the most likely code word if the acknowledge signal indicates that the count result is one.

Still another aspect of the present invention resides in a method of determining a most likely code word in a decoder of a digital data transmission system using error-correcting codes for combating noisy environments, comprising the steps of: (a) calculating a plurality of metrics each indicating closeness of a corresponding code word to a signal transmitted to the decoder, and accumulating the calculated metrics and storing same, each of the plurality of metrics being represented by a sign bit and an absolute value; (b) receiving the sign bits, counting a number of sign bits each indicating a non-negative sign bit, and generating a count result indicating that the number of the non-negative sign bits is zero or one or more than one; (c) receiving the count result and Issuing an acknowledge signal indicating that the count result is zero or one or more than one, adding a predetermined value to each of the accumulated metrics if the count result is zero, and subtracting the predetermined value from each of the accumulated metrics if the count result is more than one; and (d) receiving the sign bits and a plurality of code words previously prepared in the decoder, and selecting a code word which is defined as the most likely code word if the acknowledge signal indicates that the count result is one.

BRIEF DESCRIPTION OF THE DRAWINGS

The features and advantages of the present invention will become more clearly appreciated from the following description taken in conjunction with the accompanying drawings in which like elements or portions are denoted by like reference numerals and in which.

DETAILED DESCRIPTION OF THE PREFERRED EMBODIMENTS

Figure 1:
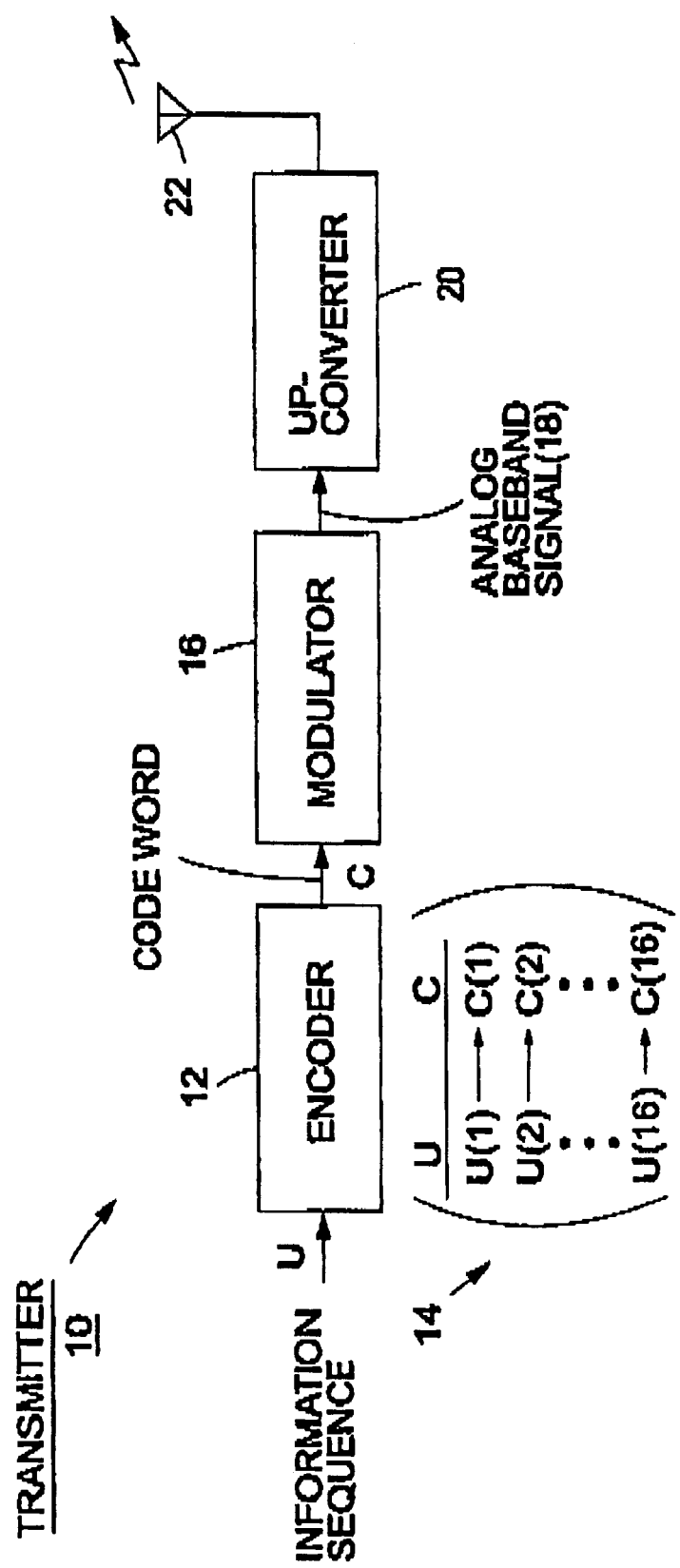
FIG. 1 is a block diagram schematically showing one example of a conventional transmitter wherein information sequences are transformed using block codes, this figure having been described in the opening paragraphs.
Figure 2:
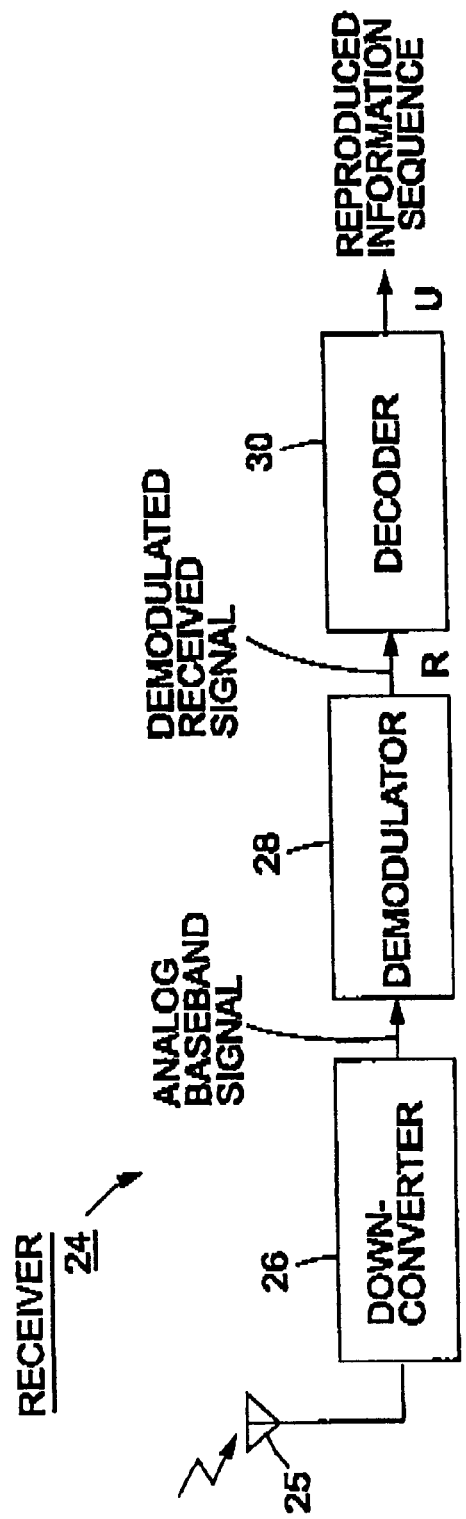
FIG. 2 is a block diagram schematically showing one example of a conventional receiver for reproducing information sequences transmitted from the transmitter of FIG. 1.

According to the present invention, an adaptively controllable threshold is introduced so as to rapidly determine a maximum metric and a code word corresponding thereto.

In more specific terms, if only one metric exists which exceeds the threshold, the metric is decided as the maximum one, and the code word corresponding thereto is selected (settled) as the most likely one. Further, if it is determined that no metric exceeds the threshold, the decoder lowers the threshold by a predetermined level and again a check is made to determine if there exists a single metric in excess of the lowered threshold. Contrarily, if more than one metrics are found in excess of the threshold, the decoder raises the threshold by the predetermined level and restarts the above-mentioned check. These operations, while changing the threshold's level (if necessary), are repeated until determining the maximum metric. By doing so, it is possible to finalize the maximum metric (viz., most likely code word) with extensively small amount of computations and at the same time with a small delay, both relative to the conventional techniques.

The aforesaid procedures is based on the fact that the maximum metric, detected in an error-correcting decoder, is typically larger than the second largest metric by a constant value with high probability. This is because the set of code words used in error-correcting coding is selected such that the Hamming distance between two arbitrary code words tends to exceed a predetermined value.

A first embodiment of the present invention will be described with reference to FIGS. 6–10. The first embodiment is directed to rapidly determining the most likely code word at an error-correcting decoder using block codes. The portions other than the most likely code word determiner can be configured using known techniques such as described in the opening paragraphs, and thus, the descriptions thereof will be omitted for the sake of simplifying the instant disclosure, and further, some of the like reference numerals and/or symbols used in FIGS. 1–5 will be used in the following descriptions.

Figure 3:
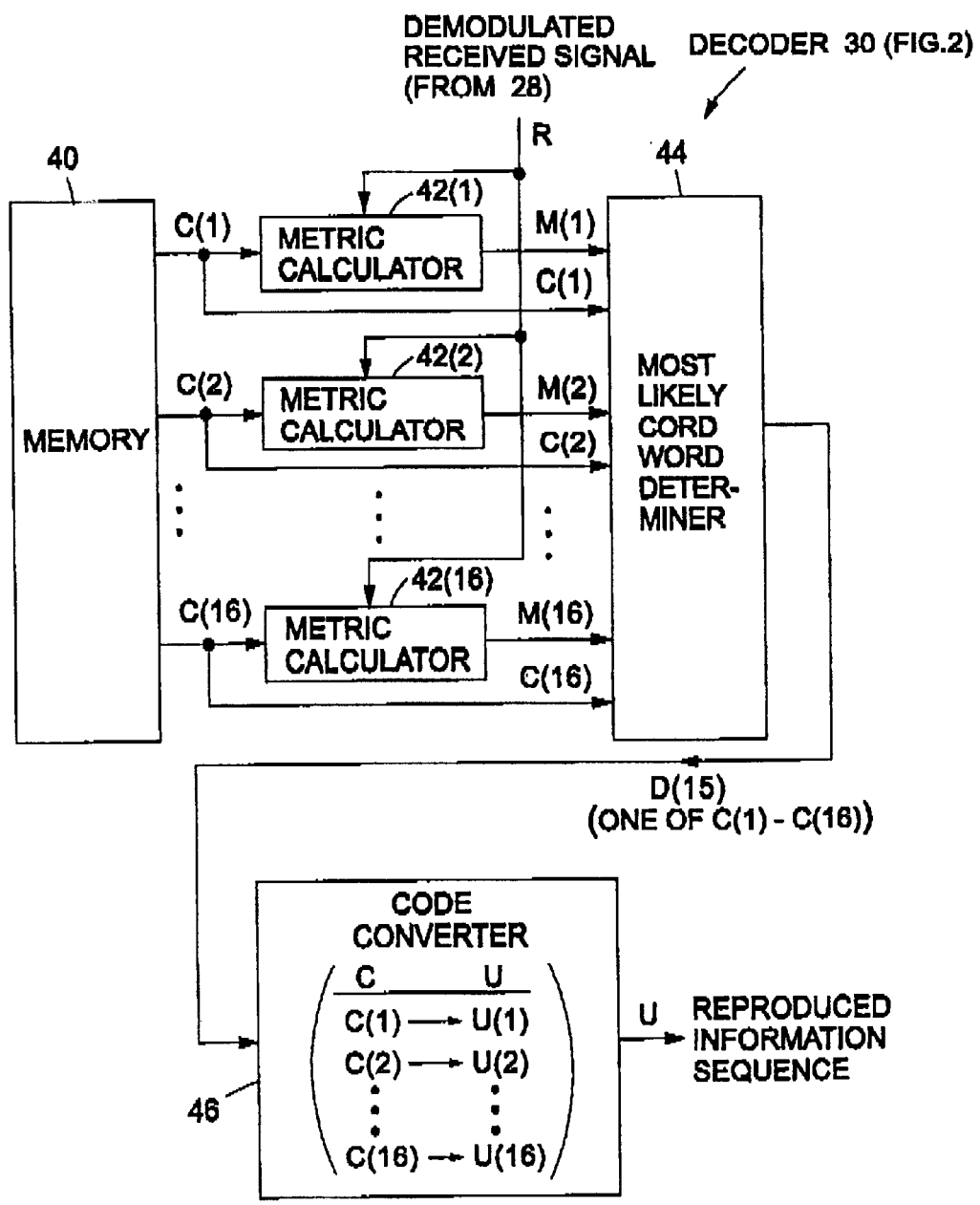
FIG. 3 is a block diagram showing the detail of a decoder provided in the receiver of FIG. 2.
Figure 6:
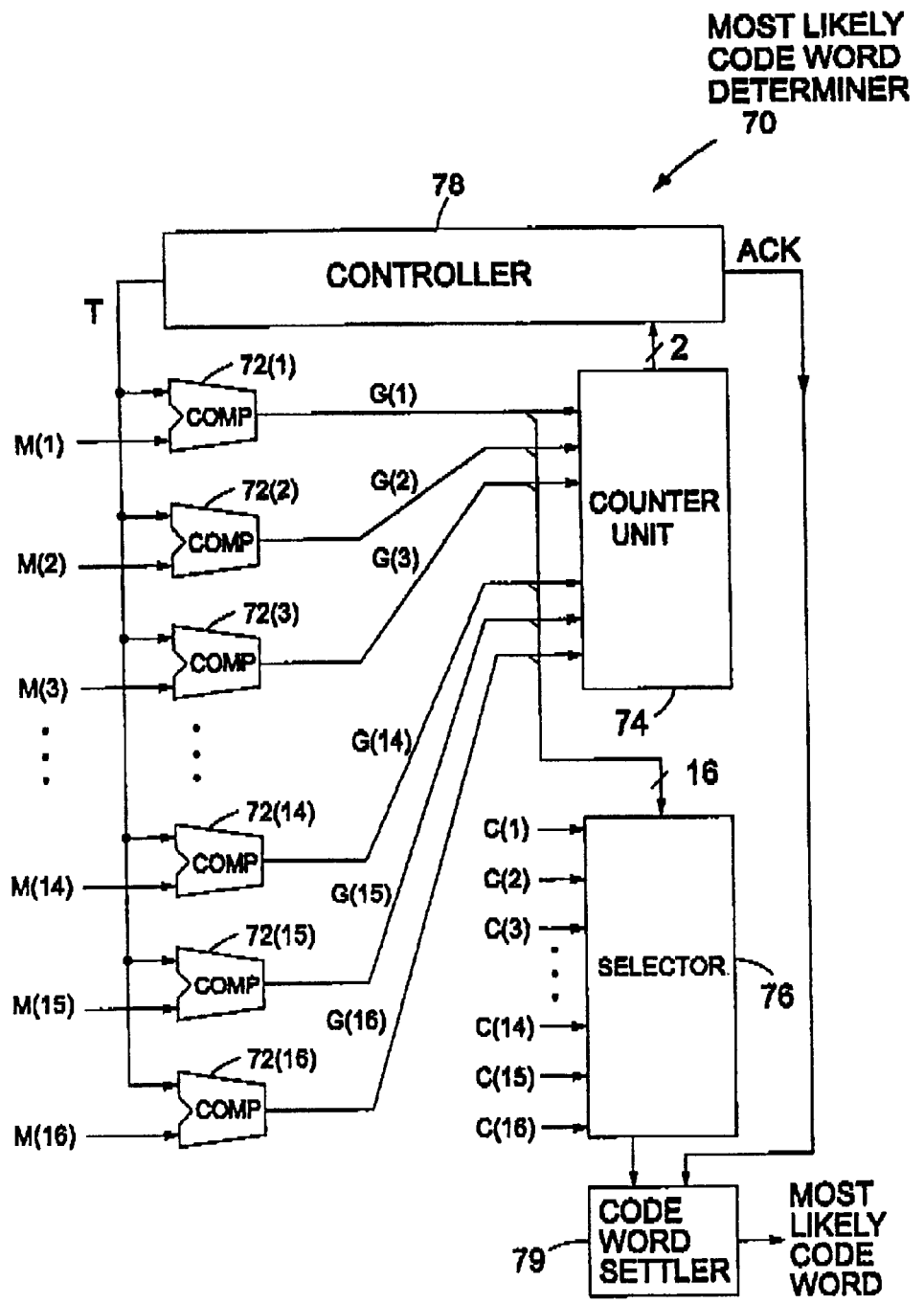
FIG. 6 is a block diagram showing a most likely code word determiner according to a first embodiment of the present invention.

FIG. 6 schematically shows a most likely code word determiner (depicted by numeral 70) of the first embodiment, which corresponds to the counterpart 44 of FIG. 3, in order to simplify the descriptions, it is assumed that the metrics $M(1)$–$M(16)$ and the code words $C(1)$–$C(16)$ both shown in FIG. 3 are inputted to the determiner 70 of FIG. 6. As shown in FIG. 6, the most likely code word determiner 70 is comprised of comparators 72(1)–72(16), a counter unit 74, a selector 76, a controller 78, and a code word settler 79, all of which are coupled as shown. The comparators 72(1)–72(16) respectively receive the metrics $M(1)$–$M(16)$ from the metric calculators 42(1)–42(16) (FIG. 3), and also receive a threshold T from the controller 78 Since the comparators 72(1)–72(16) are substantially identical with each other in terms of both configuration and function, reference is made only to the comparator 72(1). If the comparator 72(1) decides that the metric $M(1)$ is equal to or larger than the threshold (viz., if $M(1) \geq T$) at a given operation time unit, the comparator 72(1) generates the output thereof, depicted by $G(1)$, which takes a logic level 1 (for example). Otherwise (viz., if $M(1)<T$), the comparator 72(1) generates the output $G(1)$ taking a logic level 0. This operation is applicable to the remaining comparators 72(2)–72(16) which respectively issue outputs $G(2)$–$G(16)$. All the outputs $G(1)$–$G(16)$ of the comparators 72(1)–72(16) are fed to the counter 74 and the selector 76 as well. It goes without saying that the above-mentioned conditions "if $M(1) \geq T$" and "if $M(1)<T$" can be replaced by "if $M(1)>T$" and "if $M(1) \leq T$", respectively.

The counter unit 74 receives the comparison results $G(1)$–$G(16)$ each of which takes either a logic 1 or 0, and counts the number of logic 1s. In more specific terms, the counter unit 74 operates such as to generate 2-bit data "01" if the number of logic level 1s among the comparators' outputs $G(1)$–$G(16)$ is one (unity), and generate "00" if the number of logic level 1s is zero, and generate "11" if the number of logic level 1s is two or more than two.

Following this, the counter unit 74 applies the count result of 2 bits to the controller 78. If the counter result outputted from the counter unit 74 is "11", the controller 78 responds to this count result and raises the threshold T by a predetermined value (Δ) and, and applies the raised threshold T to the comparators 72(1)–72(16). In this case, the controller 78 issues an acknowledge signal ACK taking a logic level 0 indicating that the number of logic level 1s among the comparison results G(1)–G(16) is not one (1). The signal ACK is applied to the code word settler 79, which responds to the signal ACK and neglects the output of the selector 76 in this case. Subsequently, the comparators 72(1)–72(16) respectively compare the raised threshold T with the corresponding metrics M(1)–M(16). The code word settler 79 per se can be configured using a buffer together with appropriate timing circuitry by way of example.

On the other hand, if the counter result outputted from the counter unit 74 is "00", the controller 78 responds to this count result and lowers the threshold T by the predetermined value (Δ) and applies the lowered threshold T to the comparators 72(1)–72(16). Further, in this case, the controller 78 issues an acknowledge signal ACK taking a logic level 0 indicating that the number of logic level 1s among the comparison results G(1)–G(16) is not one (1). The signal ACK is applied to the code word settler 79, which ignores the output of the selector 76 in response to the signal ACK. Subsequently, the comparators 72(1)–72(16) respectively compare the lowered threshold T with the corresponding metrics M(1)–M(16).

Contrary to the above, if the counter result outputted from the counter unit 74 is "01", the controller 78 responds thereto and issues an acknowledge signal ACK taking a logic level 1, which indicates that the number of logic level 1s among the comparator outputs G(1)–G(16) is one (1). The acknowledge signal ACK, which takes a logic 1, represents that the presence of the maximum metric has been detected. The code word settler 79 is responsive to the signal ACK and allows the output of the selector 76 to pass therethrough, which output is the code word corresponding to the maximum metric.

Figure 7:
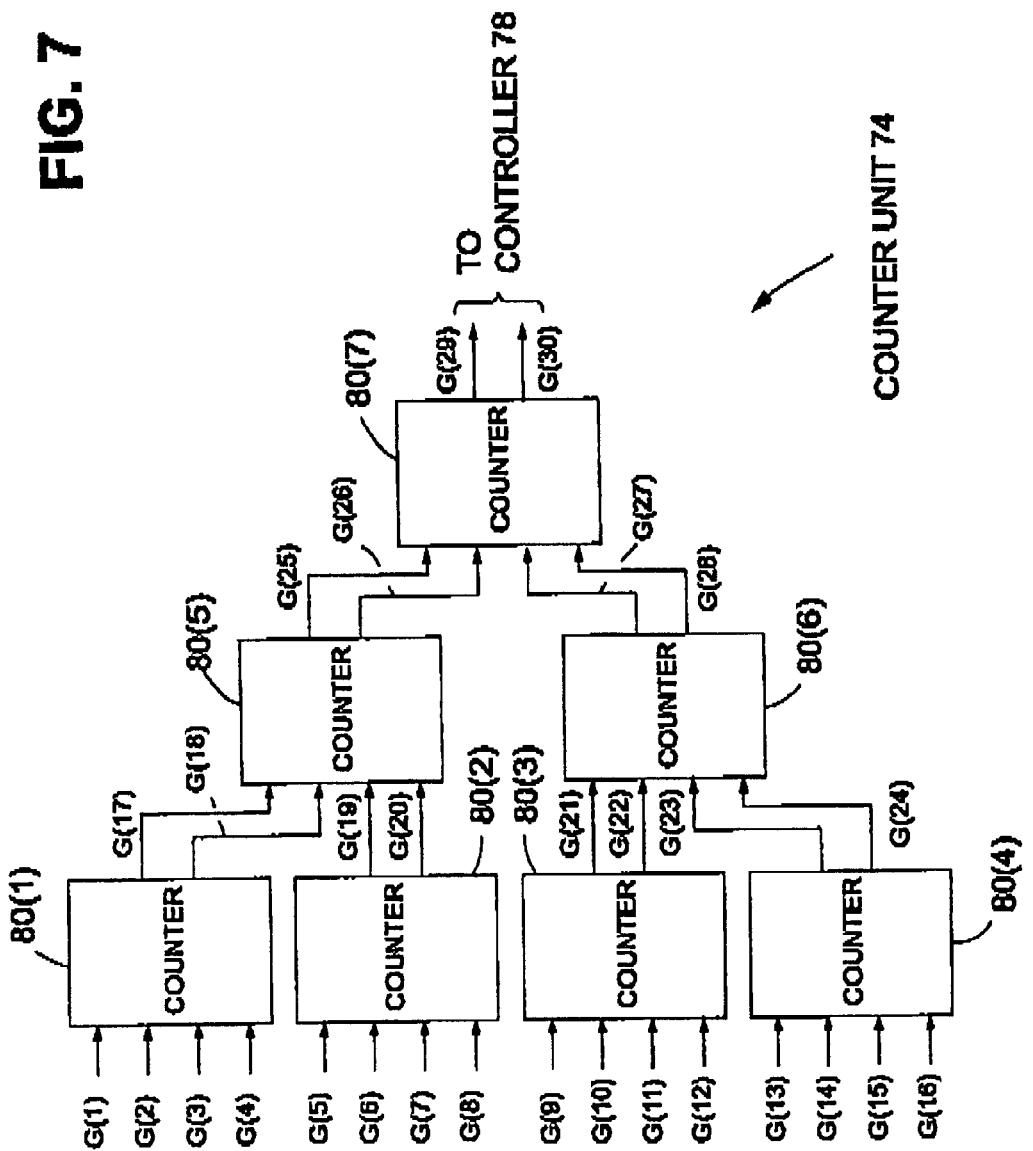
FIG. 7 is a block diagram showing the detail of a counter unit provided in the determiner of FIG. 6.

Reference is made to FIG. 7, there is shown one example of the counter unit 74 (FIG. 7), which comprises counters 80(1)–80(7) each of which is provided with four inputs and generates the above mentioned 2-bit output which takes "00", "01", or "11" depending on the comparison results applied thereto. One comparator forming part of the FIG. 7 arrangement will be described below in detail.

Figure 8:
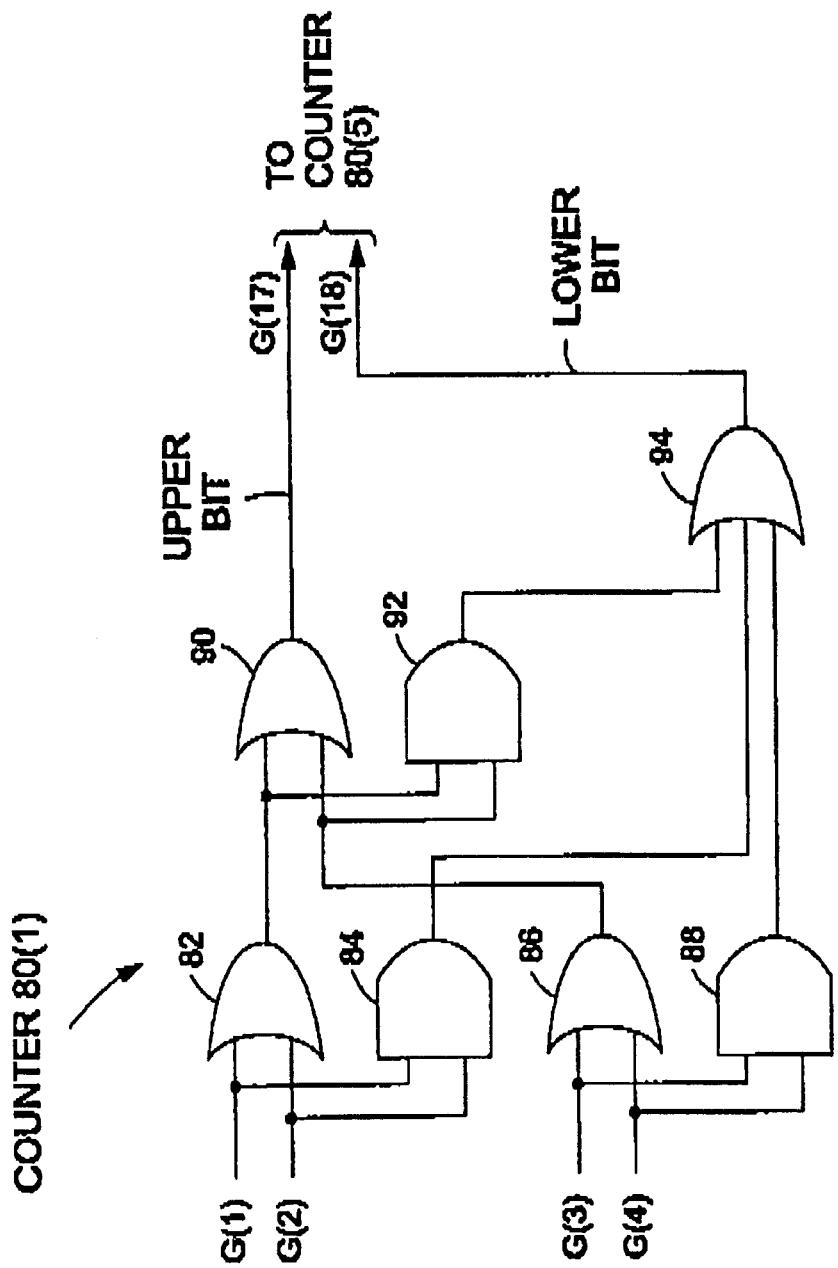
FIG. 8 is a block diagram showing the detail of a counter provided in the counter unit of FIG. 7.

FIG. 8 is a diagram showing an example of the counter 80(1). As shown in FIG. 8, the counter 80(1) comprises four OR gates 82, 86, 90, and 94, and three AND gates 84, 88, and 92. The operation of the circuit of FIG. 8 is readily understandable to those skilled in the art. That is, if none of the comparison results G(1)–G(4) takes a logic level 1, the counter 80(1) outputs the 2-bit data "00" (G(17)=0 and G(18)=0). Further, if only one among the comparison results G(1)–G(4) takes a logic level 1, the counter 80(1) generates the 2-bit data "01" (G(17)=0 and G(18)=1). Still further, if two or more than two among the comparison results G(1)–G(4) take a logic level 1, the counter 80(1) generates the 2-bit data "11" (G(17)–=1 and G(18)=1).

The outputs G(17) and G(18) of the comparator 80(1), shown in FIG. 8, are applied to the following counter 80(5). Each of the remaining counters 80(2)–80(7) operates in exactly the same manner as the comparator 80(1), and the final outputs G(29) and G(30) (viz., 2-bit data) are applied to the controller 78, it is therefore understood that the counter unit 74 generates "00" only if none of the comparison results G(1)–G(16) takes a logic level 1, generating "01" only if one of the comparison results G(1)–G(16) takes a logic level 1, and generating "11" only if two or more than two comparison results G(1)–G(16) take a logic level 1. It is to be noted that the computation speed at each of the counters 80(1)–80(7) is very high compared to each selector of FIG. 4.

Figure 9:
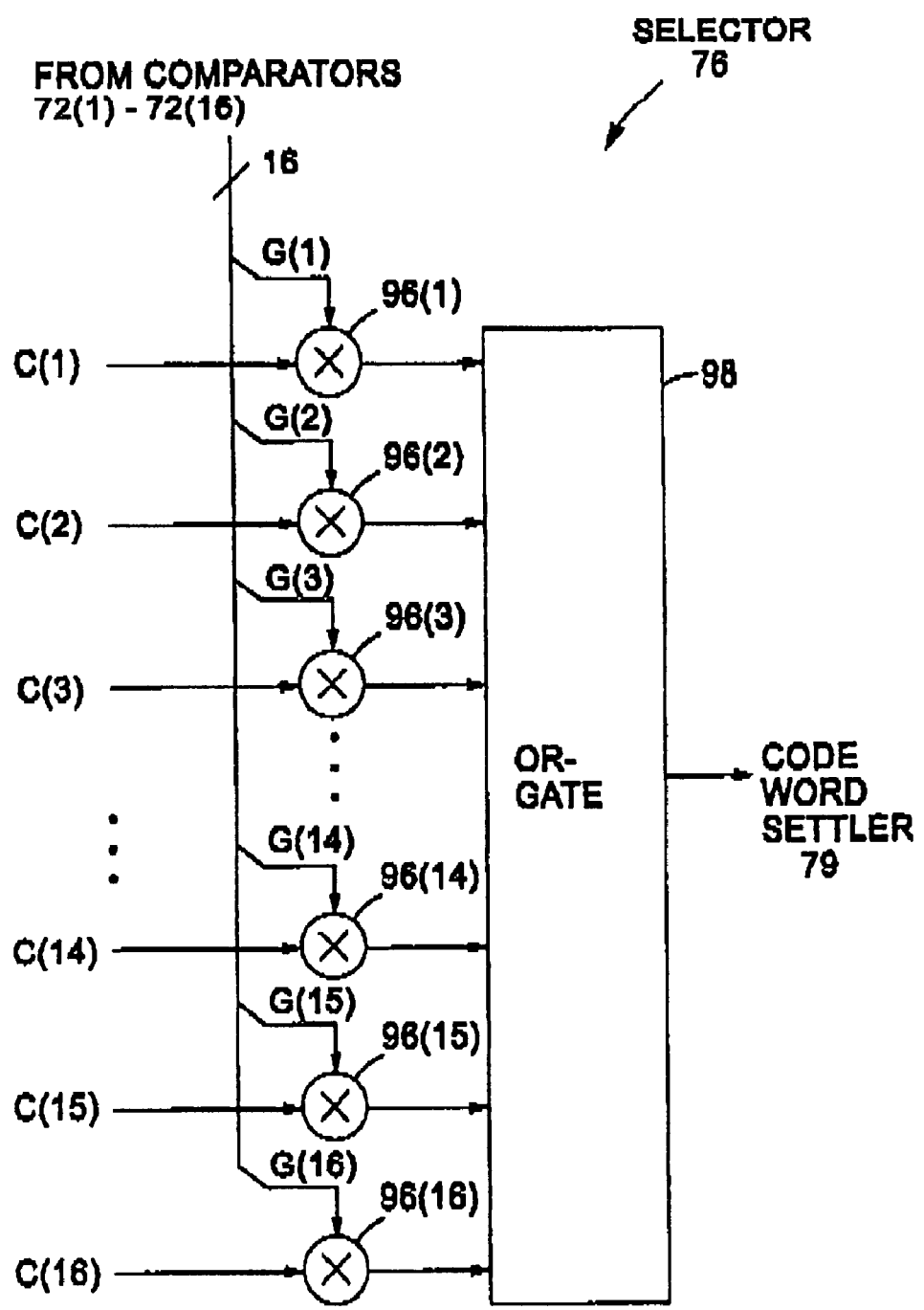
FIG. 9 is a block diagram showing the detail of a selector provided in the most likely code word of FIG. 8.

FIG. 9 shows one example of the selector 76 (FIG. 6), which comprises AND gates 96(1)–96(16) and an OR gate 98. The AND gates 96(1)–96(16) are respectively supplied with the code words C(1)–C(16) and the comparison results G(1)–G(16). The AND gate 96(1) successively carries out logical AND operations between the comparison result G(1) and each bit of the code word C(1), and applies the logical product to the OR gate 98. It follows that if G(1) takes a logic level 1, the AND gate 96(1) allows the code word C(1) to pass therethrough, and if G(1) is a logic level 0, the AND gate 96(1) outputs a bit sequence of all zeros, whose bit length is equal to that of the code word C(1).

Each of the other AND gates 96(2)–96(16) operates in exactly the same manner as the gate 98(1), and then applies the corresponding logical product to the OR gate 98, it is understood that if only one comparison result G(k) (k=1, 2, . . . , 16) exhibits a logic level 1, the OR gate 98 passes the corresponding cord word C(k) as the maximum metric. In this case, as mentioned above, the controller 78 issues the acknowledge signal ACK which takes a logic level 1. In other words, if ACK does not take a logic level 1, then the output of the OR gate 98 is neglected at the code word settler 79.

Figure 10:
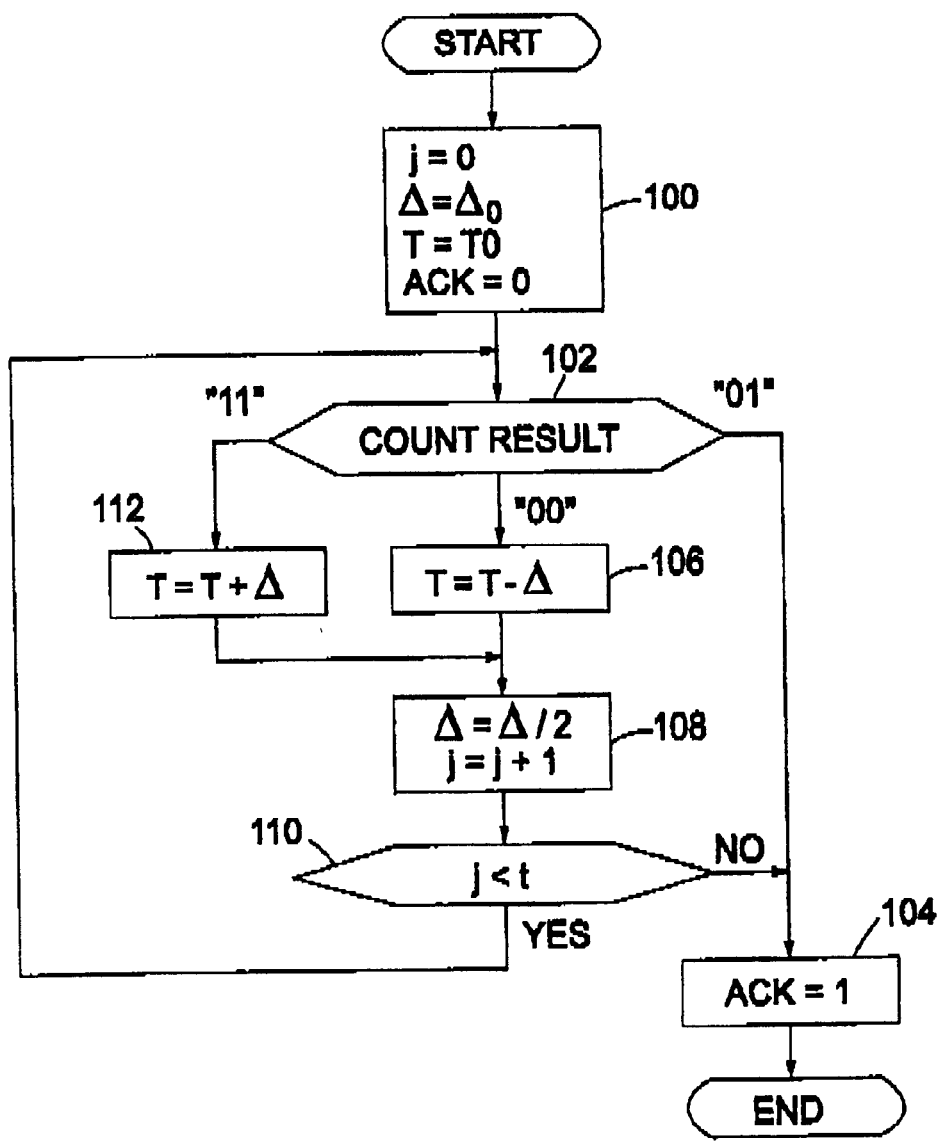
FIG. 10 is a flow chart which includes steps which characterize the operation of the most likely code word determiner of FIG. 6.

FIG. 10 is a flow chart which comprises the steps which characterize the operation of the first embodiment of the present invention. At step 100, the number of iterated operations (viz., looped operations), depicted by j, is initialized to zero (0), and the threshold increment/decrement integer Δ is set to an initial value $Δ_0$, and the threshold T is set to an initial value T0, and the acknowledge signal ACK is set to a logic level 0. Following this, the routine goes to step 102 at which a check is made to determine if the count result (viz., the output of the counter unit 74) is "00", "01", or "11". If the count result is "01", the program advances to step 104 at which the acknowledge signal ACK is changed to a logic level 1 and the routine is terminated, which means that, as above mentioned, the maximum metric has been determined and the cord word corresponding thereto is obtained.

On the other hand, if the count result is found to be "00" at step 102, the routine goes to stop 106 at which the threshold T is lowered by a predetermined integer Δ. Thereafter, the routine advances to step 108, at which the number of operations j is incremented by one and the threshold change level a is halved (viz., Δ=Δ/2). The integer Δ is a design parameter that is selected to minimize the average number of computations, and is in no way limited to the halving of the previous integer Δ.

Following this, the program goes to step 110 at which a check is made to determine if j is less than the predetermined number t (typically 4 or 5 merely by way of example). If the inquiry made at step 110 is affirmative (viz., YES), the routine goes back to step 102, and otherwise (viz., NO), the routine goes to step 104 at which the acknowledge signal ACK is changed to a logic 1. In the event that the decoder is eventually unable to find the maximum code word after the predetermined number of trials (viz., j), it is preferable in practice to issue a certain signal for advising the decoder of the failure in detection of the most likely code word. To this end, if the routine advances to step 104 by way of step 110, the controller 78 sets the acknowledge signal ACK to a logic 1 although the code word outputted from the selector 76 is not the maximum one. At step 102, if the count result is specified as "11", the routine goes to step 112 at which the threshold T is raised by the integer Δ, after which the routine goes to step 108. Subsequently, the above-mentioned routine continues until the signal ACK takes a logic level 1 or the number of looped operations reaches t.

As mentioned above, the first embodiment, wherein the block codes are used, is made based on the fact that the threshold is adaptively controlled so as to effectively reduce average computations until determining the most likely code word in the decoder. This concept is also applicable to the digital data transmission that utilizes the convolutional codes for the same purposes, viz., for combating noisy environments. A second embodiment is directed to such a transmission system, and will be described with reference to FIGS. 11–14.

In order to simplify the descriptions of the second embodiment, it is assumed that each of messages to be transmitted has been convolutionally encoded, at a transmitter, into one of 16 different possible cord words C'(1)–C'(16). Further, as in the first embodiment, the code word is translated into the analog baseband signal, being up-converted, and transmitted to a receiver. Subsequently, at the receiver, the received high frequency signal is down-converted, and demodulated and applied to the decoder shown in FIG. 11.

Figure 11:
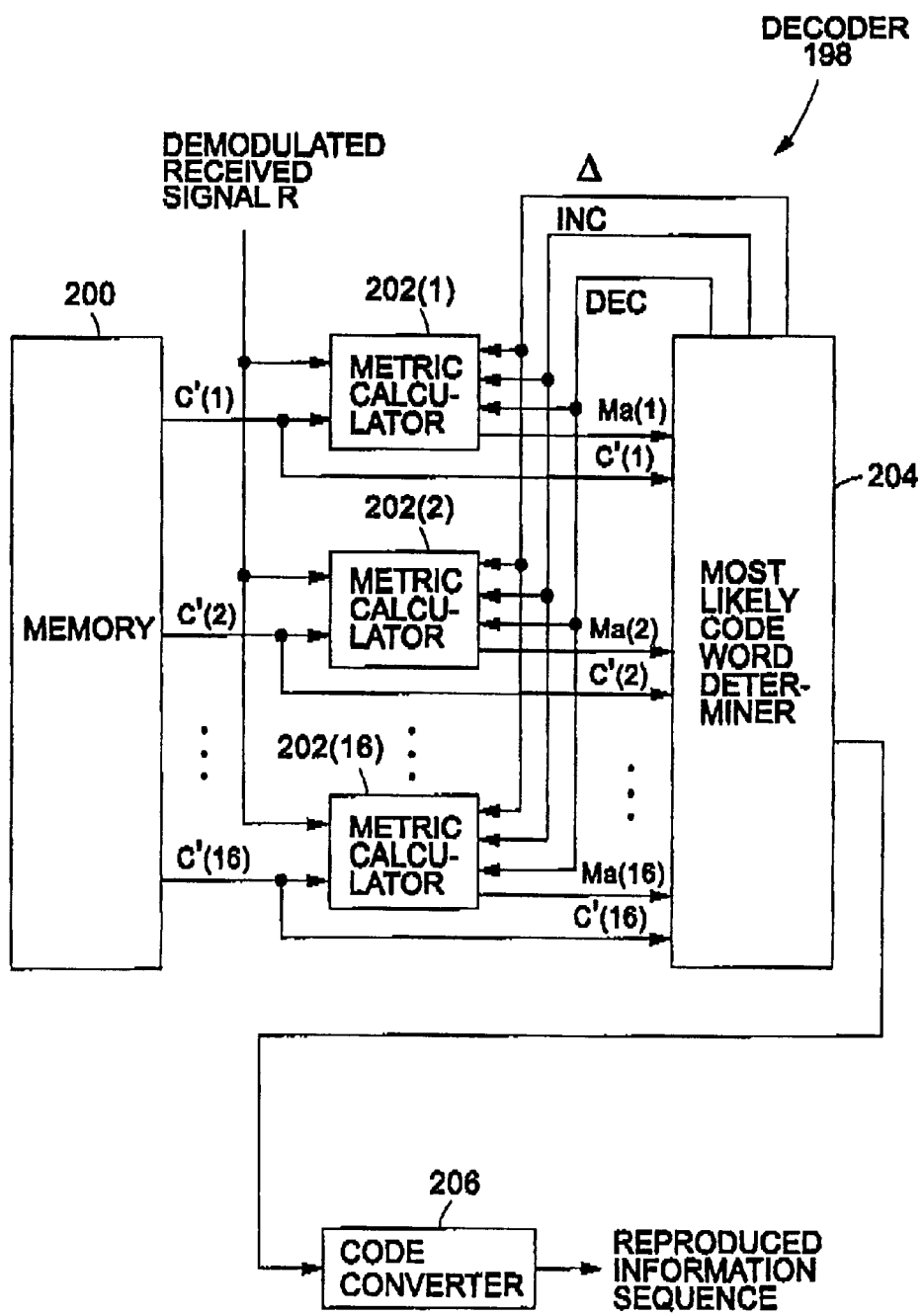
FIG. 11 is a block diagram showing a decoder to which a second embodiment of the present invention is applicable.

Reference is made to FIG. 11, a decoder 198 is shown in block diagram form, which decoder is configured in a manner somewhat similar to the decoder 30 of FIG. 3. As illustrated, the decoder 198 is comprised of a memory 200, a plurality of metric calculators 202(1)–202(16) which are identical with each other in both configuration and function, a most likely code word determiner 204, and a code converter 206. The metric calculators 202(1)–202(16) are respectively supplied with the code words C'(1)–C'(16) which are previously stored in the memory 200 and which are identical to those used in the transmitter. Further, the metric calculators 202(1)–202(16) are also supplied with the received signal R which has been demodulated at a preceding demodulator that corresponds to the demodulator 28 of FIG. 2.

Figure 13A:
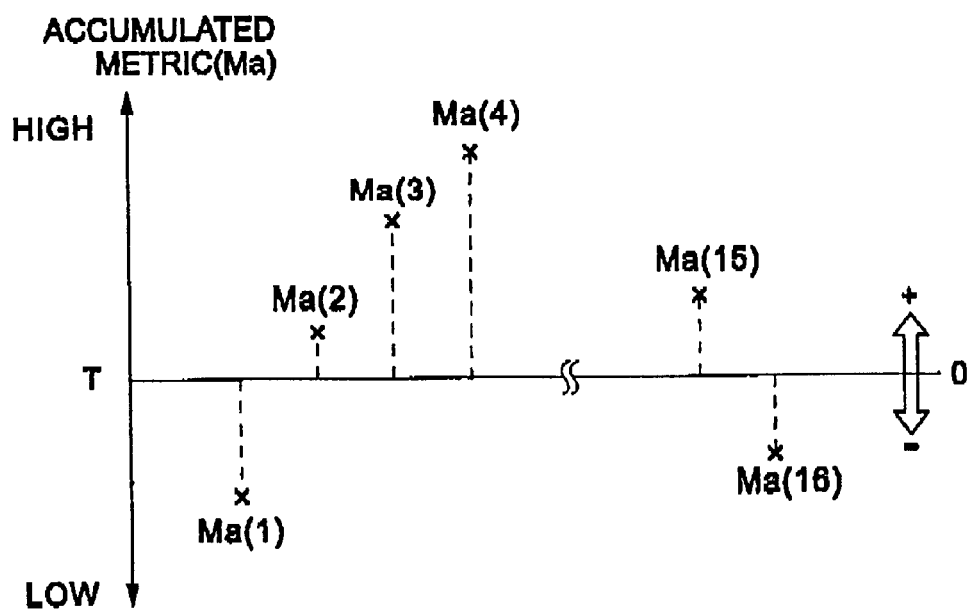
FIGS. 13A to 13C are diagrams each schematically showing a plurality of metrics with respect to a threshold at a zero level.

As is well known in the art, each convolutionally encoded block (code word) depends not only on the corresponding message at the same time unit, but also on the predetermined number of previous messages, and hence, a metric of a received signal with respect to one of the code words C'(1)–C'(16) is unable to be decided based on a one-to-one basis as in the case of using the block codes. Accordingly, each of the metric calculators 202(1)–202(16) calculates a metric and accumulates the calculated metric therein. The accumulated metrics, depicted respectively Ma(1)–Ma(16), are typically represented with respect to zero (0) level which acts as a threshold as shown in FIG. 13A. More specifically, as shown in FIG. 13A, a given metric Ma(k) (k=1, 2, . . . , 16) is defined by both a sign bit (positive or negative) and an absolute value.

As shown in FIG. 11, the most likely code word determiner 204 receives the code words C'(1)–C'(16) from the memory 200 and the metrics Ma(1)–Ma(16), and searches the maximum metric among the metrics Ma(1)–Ma(16), and determines one code word corresponding to the maximum metric. The operation of the most likely code word determiner 204 will further be described, together with a controllable threshold changing level Δ and two signals INC and DEC that are respectively used to instruct increment and decrement of Δ. The code word thus determined and issued from the determiner 204 is subject to code conversion at the code converter 206 and outputted therefrom as a reproduced information sequence.

Figure 12:
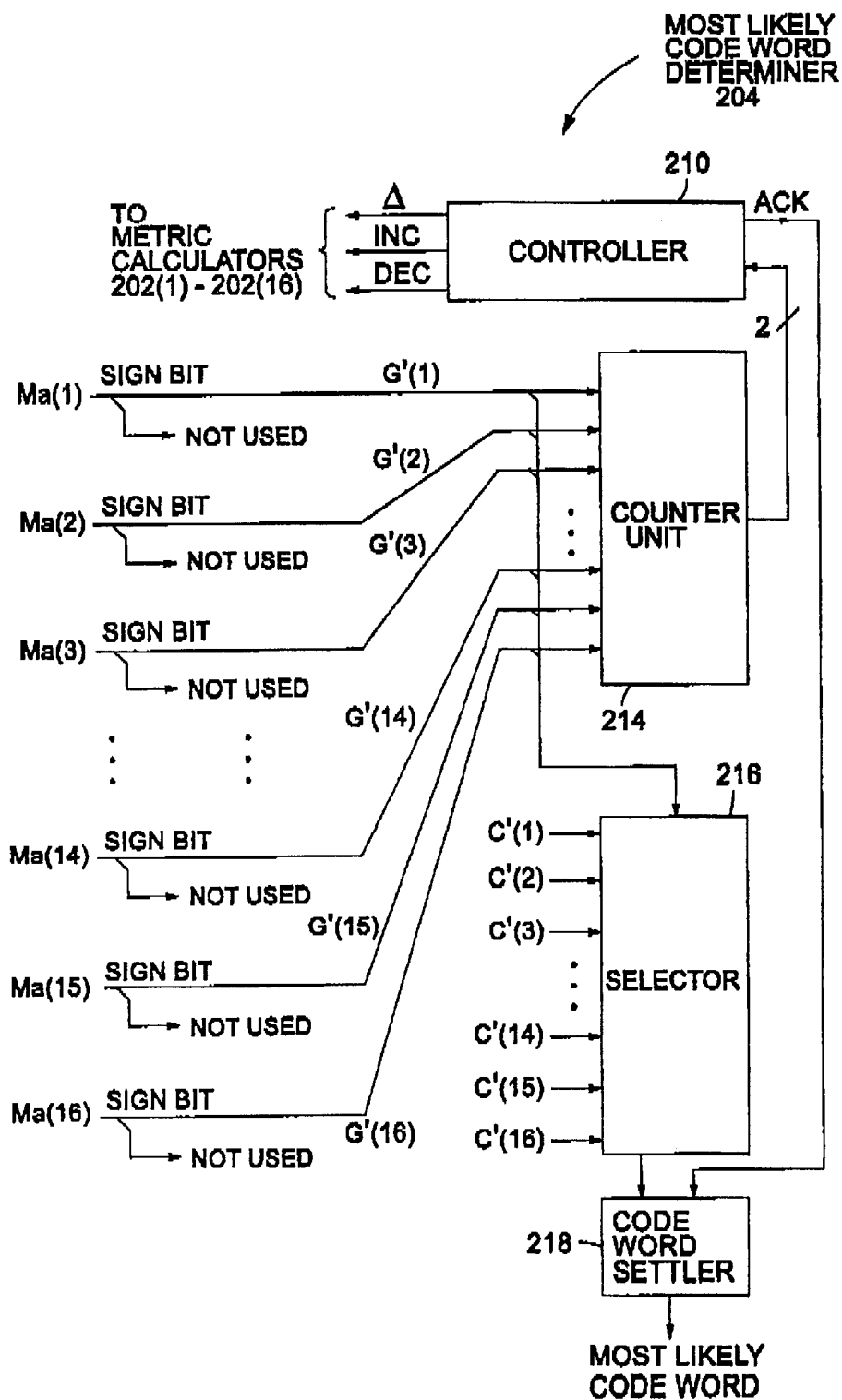
FIG. 12 is a block diagram showing a most likely code word determiner according to a second embodiment of the present invention.

FIG. 12 is a block diagram showing in detail the most likely code word determiner 204 according to the second embodiment, which comprises a controller 210, a counter unit 214, a selector 216, and a code word settler 218. The accumulated metrics Ma(1)–Ma(16) are applied to the most likely code word determiner 204 and respectively split into the sign bit and the remaining bits at bit-splitters (not shown), and then only the sign bits (depicted G'(1)–G'(16)) are applied to the counter unit 214 and also to the selector 216. It is assumed that the sign bit takes a logic level 1 and 0 respectively indicating a positive and negative number of the corresponding metric. Since the counter unit 214 and the selector 216 and the code word settler 218 are respectively identical to the counterparts 74 and 76 and 79 of FIG. 6, they will not be further described except that they become necessary in context.

The controller 210 is supplied with the 2-bit output of the counter unit 214, and issues an acknowledge signal ACK which is substantially identical to the signal ACK referred to with respect to FIG. 6. Namely, the counter unit 214 generates "00" only if none of the sign bits G'(1)–G'(16) takes a logic level 1, generating "01" only if one sign bit among G'(1)–G'(16) takes a logic level 1, and generating "11" only if two or more than two sign bits among G'(1)–G'(16) take a logic level 1.

The operation of the most likely code word determiner 204 will further be described with reference to the flow chart shown in FIG. 14 together with FIGS. 11 and 13A–13C.

Figure 14:
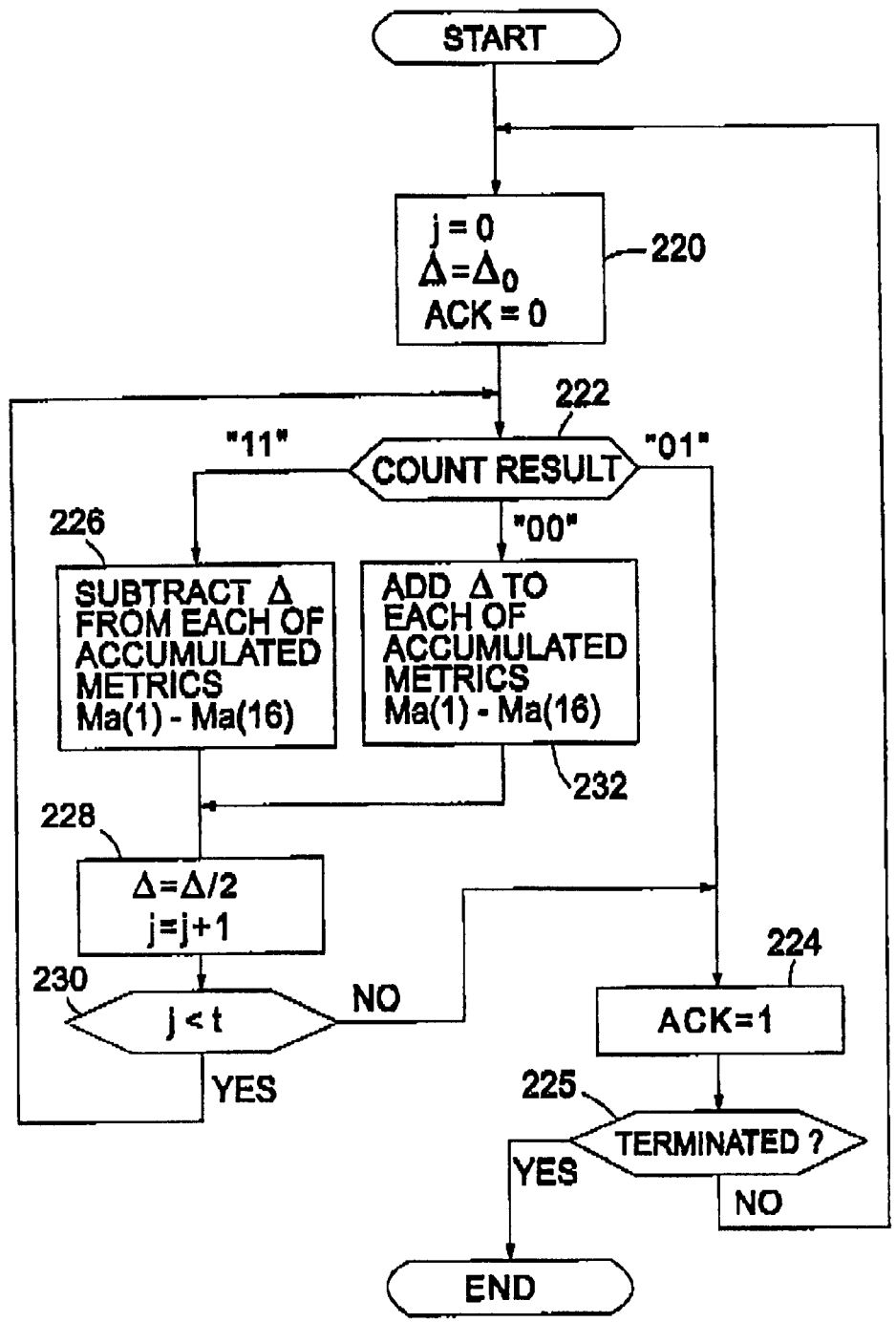
FIG. 14 is a flow chart which includes steps which characterize the operation of the most likely code word determiner of FIG. 12.

FIG. 14 is a flow chart which comprises the steps which characterize the operation of the second embodiment. At step 220, the number of iterated operations (viz., looped operations), depicted by j, is initialized to zero (0), and the threshold changing level Δ is set to an initial value $\Delta_0$, and the acknowledge signal ACK is set to a logic level 0. Following this, the routine goes to step 222 at which a check is made to determine if the count result (viz., the output of the counter unit 214) is "00", "01", or "11". If the count result is "01", the program advances to step 224 at which the acknowledge signal ACK is changed to a logic level 1. Thereafter, the program advances to step 225 at which a check is made to determine if the routine should be terminated. If the inquiry made at step 225 is affirmative (YES), the routine is terminated, and otherwise (NO), goes back to step 220. By way of example, the routine is terminated at step 225 if the decoder 198 is designed such as to be initialized when having processed a predetermined number of received sequences, the case of which however has not been described because the present invention is irrelevant thereto.

Figure 13B:
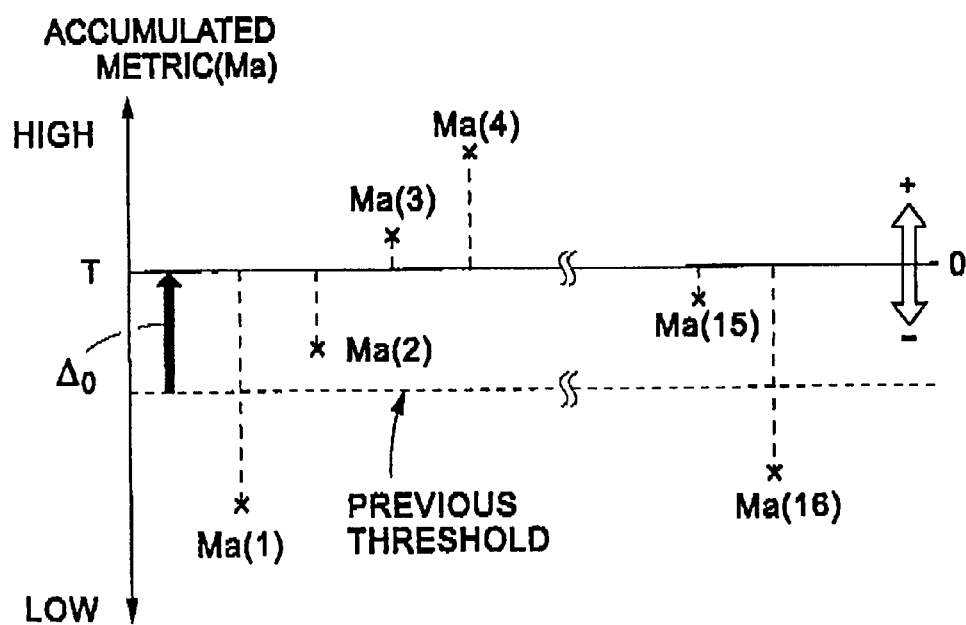

On the other hand, if the count result is found to be "11" at step 222, the routine goes to step 226. For a better understanding of this case, reference is made to FIG. 13A wherein four metrics Ma(2), Ma(3), Ma(4) and Ma(15) are in excess of the threshold T (viz., zero level). At step 226, the threshold change level Δ (noting that Δ has been set to $\Delta_0$ at step 220) is subtracted from each of the accumulated metrics Ma(1)–Ma(16), which is equivalent to the fact that the threshold T is raised by $\Delta_0$, as shown in FIG. 13B. Subsequently, the routine advances to step 228 at which the number of operations j is incremented by one and the threshold change level Δ is halved (viz., Δ=Δ/2).

Following this, the program goes to step 230 whereat a check is made to determine if is less than the predetermined number t (typically 4 or 5 merely by way of example). If the inquiry made at stop 230 is affirmative (YES), the routine goes back to step 222, and otherwise (NO), the routine goes to step 224 at which the acknowledge signal ACK is changed to a logic 1. The reason why the signal ACK is set to a logic level 1 when the routine goes to step 224 via step 230 has been described with reference to the first embodiment, and thus, further description thereof will be omitted for brevity.

Figure 13C:
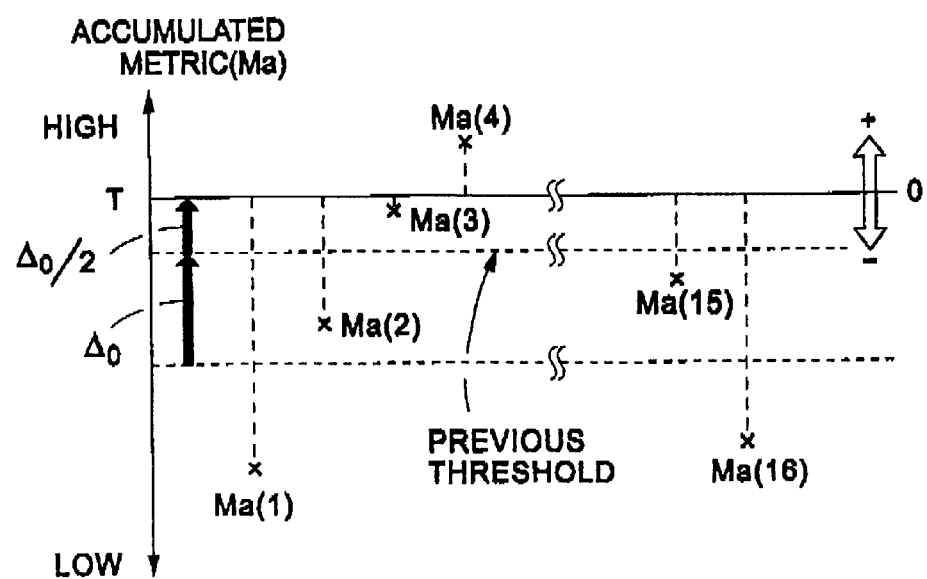

At step 222, if the count result is again specified as "11" as in the case shown in FIG. 13B, the routine goes to stop 226 at which the threshold change level Δ/2 (noting that Δ has been halved at step 228 in the preceding loop) is subtracted from each of the accumulated metrics Ma(1)–Ma(16), which is equivalent to the fact that the threshold T is raised by $\Delta_0/2$ as shown in FIG. 13C. Subsequently, the routine advances to step 228. In this particular case, there exists only one metric Ma(4) exceeding the threshold T (viz., zero level) as shown in FIG. 13C, the routine goes to step 224 via steps 230 and 222, thereby to specify the maximum metric.

On the other hand, at step 222, if the count result is found "00", the program goes to step 232 at which the threshold change level Δ (noting that Δ has been set to $\Delta_0$ at step 220) is added to each of the accumulated metrics Ma(1)–Ma(16), which is equivalent to the fact that the threshold T is lowered by $\Delta_0$. In this case, although not shown in figures, it is understood that the decoder 198 operates such as to search a single metric exceeding the threshold T (viz., zero level) by lowering the same.

Figure 4:
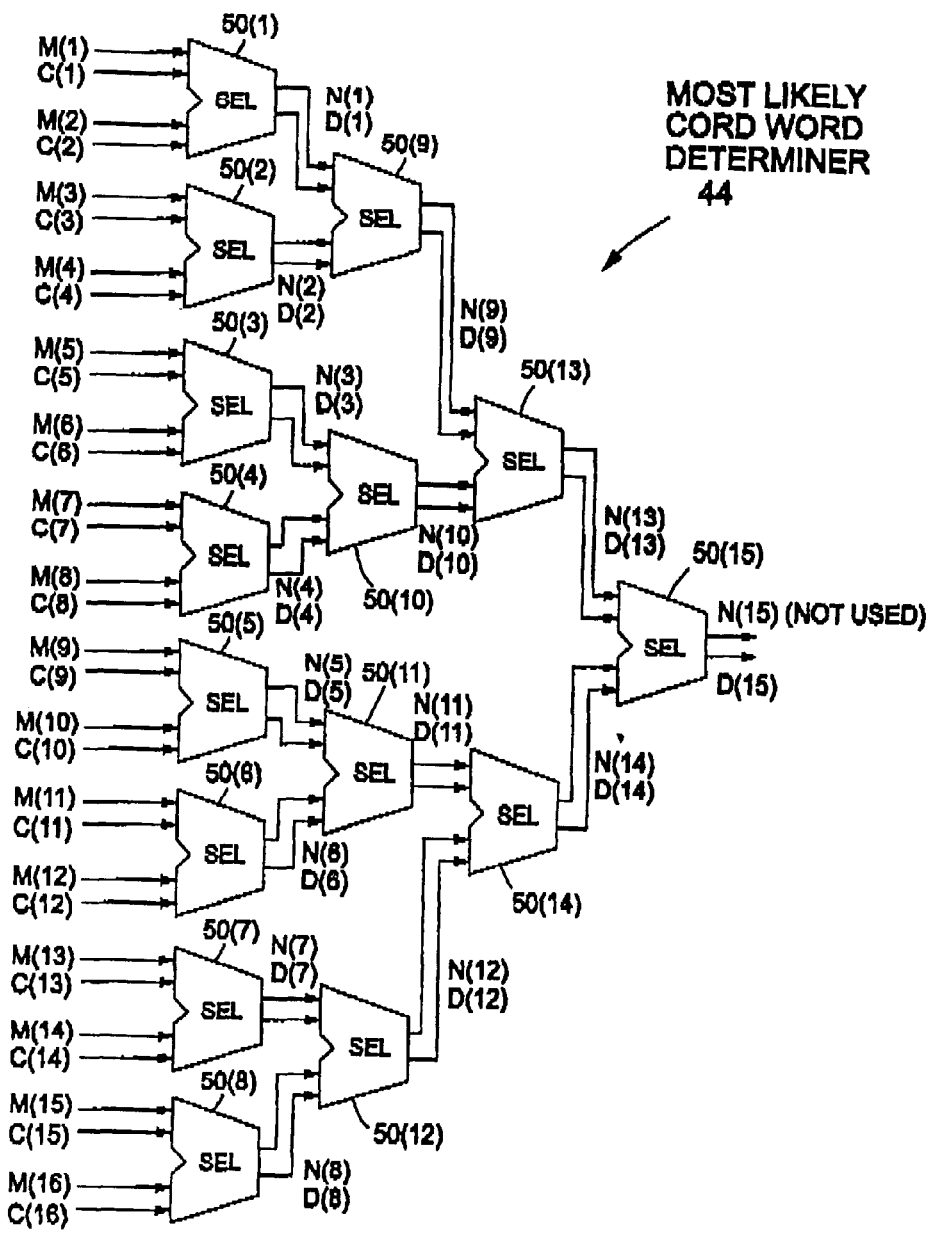
FIG. 4 is a block diagram showing the detail of a most likely code determiner provided in the decoder of FIG. 3.
Figure 5:
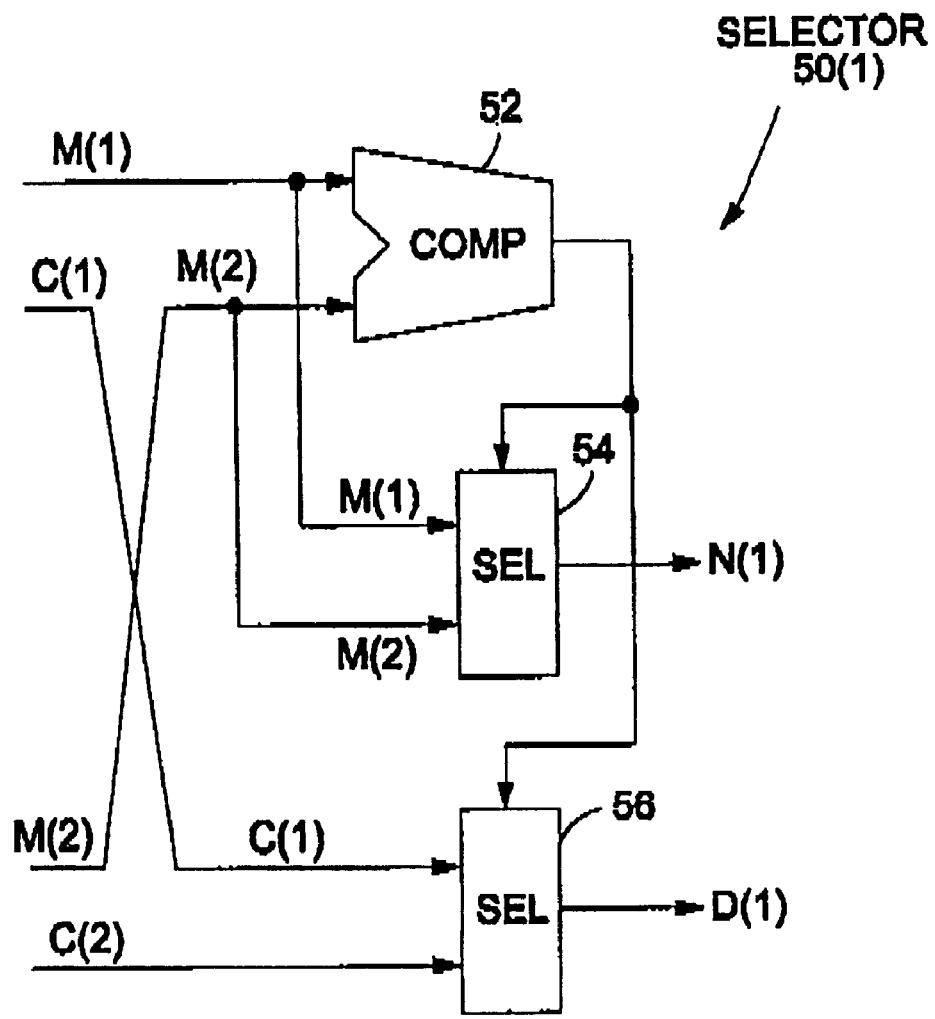
FIG. 5 is a block diagram showing the detail of a selector forming part of the most likely code determiner of FIG. 4.

As mentioned above, the present invention is able to reduce the number of the metric selecting stages as shown in FIG. 4, thereby to markedly increase the decoding speed of determining the most likely code word.

The present invention has been discussed after having described the digital radio transmission system as prior art. However, this invention is in no way limited to the radio communication (transmission) systems, and is applicable to communication through wire such as a telephone line, and also to a variety of storage systems which include semiconductor memories, magnetic units, optical memory units, and so on, each of which might be subject to various types of noise disturbances.

The foregoing descriptions show only two preferred embodiments and some modifications thereof. However, other various modifications are apparent to those skilled in the art without departing from the scope of the present invention which is only limited by the appended claims. Therefore, the embodiments and modification shown and described are only illustrated, not restrictive.

What is claimed is:

1. A most likely code word determiner provided in a decoder of a digital data transmission system using error-correcting codes for combating noisy environments, comprising:

a plurality of comparators which respectively receive a plurality of metrics each indicating closeness of a corresponding code word to a signal transmitted to the decoder, said plurality of comparators respectively comparing said plurality of metrics with a threshold and generating a plurality of comparison results;

a counter coupled to receive said plurality of comparison results, counting a number of comparison results each of which indicates that the corresponding metric exceeds said threshold, and generating a count result indicating that said number of comparison results is zero or one or more than one;

a controller coupled to receive said count result and issuing an acknowledge signal indicating that said count result is zero or one or more than one, said controller changing said threshold if said count result is zero or more than one and applying the changed threshold to said plurality of comparators; and a selector coupled to receive said plurality of comparison results and a plurality of code words previously prepared in the decoder, said selector selecting a code word which is defined as said most likely code word if said acknowledge signal indicates that said count result is one.

2. The most likely code word determiner as claimed in claim 1, wherein said controller lowers and raises the threshold in response to the count result which is zero and more than one, respectively.

3. The most likely code word determiner as claimed in claim 1, wherein said controller narrows increment and decrement of said threshold with increase in a number of changes of said threshold.

4. The most likely code word determiner as claimed in claim 2 or 3, wherein said controller terminates control operation thereof when a number of the threshold changes reaches a predetermined number.

5. A method of determining a most likely code word in a decoder of a digital data transmission system using error-correcting codes for combating noisy environments, comprising the steps of:

(a) receiving a plurality of metrics each indicating closeness of a corresponding code word to a signal transmitted to the decoder, comparing said plurality of metrics with a threshold, and generating a plurality of comparison results;

(b) receiving said plurality of comparison results, counting a number of comparison results each of which indicates that the corresponding metric exceeds said threshold, and generating a count result indicating that said number of comparison results is zero or one or more than one;

(c) receiving said count result and issuing an acknowledge signal indicating that said count result is zero or one or more than one, changing said threshold if said count result is zero or more than one and generating the changed threshold which is used at step (a); and (d) receiving said plurality of comparison results and a plurality of code words previously prepared in the decoder, and selecting a code word which is defined as said most likely code word if said acknowledge signal indicates that said count result is one.

6. The method as claimed in claim 5, wherein said threshold is lowered and raised if the count result indicates one and more than one, respectively.

7. The method as claimed in claim 5, wherein at step (c), increment or decrement of said threshold is narrowed with increase in a number of changes of said threshold.

8. A most likely code word determiner provided in a decoder of a digital data transmission system using error-correcting codes for combating noisy environments, comprising:

a plurality of metric calculators for respectively calculating a plurality of metrics each indicating closeness of a corresponding code word to a signal transmitted to the decoder, and accumulating the calculated metrics and storing same therein, each of said plurality of metrics being represented by a sign bit and an absolute value;

a counter coupled to receive said sign bits, counting a number of sign bits each indicating a non-negative sign bit, and generating a count result indicating that the number of the non-negative sign bits is zero or one or more than one;

a controller coupled to receive said count result and issuing an acknowledge signal indicating that said count result is zero or one or more than one, said controller operating such as to add a predetermined value to each of the accumulated metrics if said count result is zero, and subtract the predetermined value from each of the accumulated metrics if said count result is more than one; and a selector coupled to receive said sign bits and a plurality of code words previously prepared in the decoder, said selector selecting a code word which is defined as said most likely code word if said acknowledge signal indicates that said count result is one.

9. The most likely code word determiner as claimed in claim 8, wherein said controller respectively lowers and raises said predetermined value in response to the count result which is zero and more than one, respectively.

10. The most likely code word determiner as claimed in claim 8, wherein said controller narrows increment and decrement of said predetermined value with increase in a number of changes of the predetermined value.

11. The apparatus as claimed in claim 9 or 10, wherein said controller terminates the control operation thereof when the number of control operations of the predetermined value reaches a predetermined number.

12. A method of determining a most likely code word in a decoder of a digital data transmission system using error-correcting codes for combating noisy environments, comprising the steps of:

(a) calculating a plurality of metrics each indicating closeness of a corresponding code word to a signal transmitted to the decoder, and accumulating the calculated metrics and storing same, each of said plurality of metrics being represented by a sign bit and an absolute value;

(b) receiving said sign bits, counting a number of sign bits each indicating a non-negative sign bit, and generating a count result indicating that the number of the non-negative sign bits is zero or one or more than one;

(c) receiving said count result and issuing an acknowledge signal indicating that said count result is zero or one or more than one, adding a predetermined value to each of the accumulated metrics if said count result is zero, and subtracting the predetermined value from each of the accumulated metrics if said count result is more than one; and (d) receiving said sign bits and a plurality of code words previously prepared in the decoder, and selecting a code word which is defined as said most likely code word if said acknowledge signal indicates that said count result is one.

13. The method as claimed in claim 12, further comprising (e) lowering and raising said predetermined value in response to the count result which is zero and more than one, respectively.

14. The method as claimed in claim 12, wherein increment and decrement of said predetermined value is narrowed with increase in a number of changes of the predetermined value.

* * * * *